United States Patent

Kurata

[11] Patent Number: 5,917,200
[45] Date of Patent: Jun. 29, 1999

[54] OPTICAL SEMICONDUCTOR DEVICE

[75] Inventor: Kazuhiko Kurata, Tokyo, Japan

[73] Assignee: NEC Corporation, Tokyo, Japan

[21] Appl. No.: 08/452,653

[22] Filed: May 25, 1995

Related U.S. Application Data

[62] Division of application No. 08/233,941, Apr. 28, 1994, abandoned.

[30] Foreign Application Priority Data

Apr. 27, 1993 [JP] Japan ..................................... 5-125114

[51] Int. Cl.[6] ........................... H01L 27/15; H01L 33/00; H01L 23/48
[52] U.S. Cl. ................................. 257/80; 257/98; 257/99; 257/744; 257/772
[58] Field of Search .............................. 257/98, 744, 772, 257/80, 99; 228/124

[56] References Cited

U.S. PATENT DOCUMENTS

| | | | |
|---|---|---|---|
| 3,986,255 | 10/1976 | Mandal | 257/744 |
| 5,197,654 | 3/1993 | Katz et al. | 228/124 |
| 5,234,153 | 8/1993 | Bacon et al. | 228/122.1 |
| 5,280,414 | 1/1994 | Davis et al. | 361/795 |
| 5,298,735 | 3/1994 | Peterson et al. | 257/82 |

FOREIGN PATENT DOCUMENTS

| | | |
|---|---|---|
| 0119691 | 9/1984 | European Pat. Off. . |
| 0194475 | 9/1986 | European Pat. Off. . |
| 0253691 | 1/1988 | European Pat. Off. . |
| 138777 | 5/1989 | Japan . |

OTHER PUBLICATIONS

Patent Abstracts of Japan, vol. 13, No. 393 (E–814), Aug. 31, 1989.

Chin C. Lee et al., "A New Bonding Technology Using Gold and Tin Multilayer Composite Structures", IEEE Transactions on Components, Hybrids, and Manufacturing Technology, vol. 14, No. 2, Jun. 1991, pp. 407–411.

*Primary Examiner*—Valencia Martin Wallace
*Attorney, Agent, or Firm*—Sughrue, Mion, Zinn, Macpeak & Seas, PLLC

[57] ABSTRACT

An Au layer 3 and a Sn layer 5 are laminated on a barrier layer 8 which is formed on an optical circuit substrate 1. An Au layer 5 having a predetermined thickness is formed on the laminated layers as a top layer. A junction portion 2 is constituted of these layers. An electrode layer of an optical semiconductor element 9 is made to contact with the top Au layer 5 and the optical semiconductor element 9 is pressed to the optical circuit substrate 1. Then, by heating, the optical semiconductor element 9 is joined on the optical circuit substrate. A weight % of Au and Sn in the junction portion 2 of the optical circuit substrate 1 is about 80%:20% before the joining. The electrode layer is formed as a thin Au layer. The optical circuit substrate 1 is heated at a temperature of 280° C. or more such that the Au layer and the Sn layer are melted and is cooled such that Au and Sn are solidified.

6 Claims, 8 Drawing Sheets

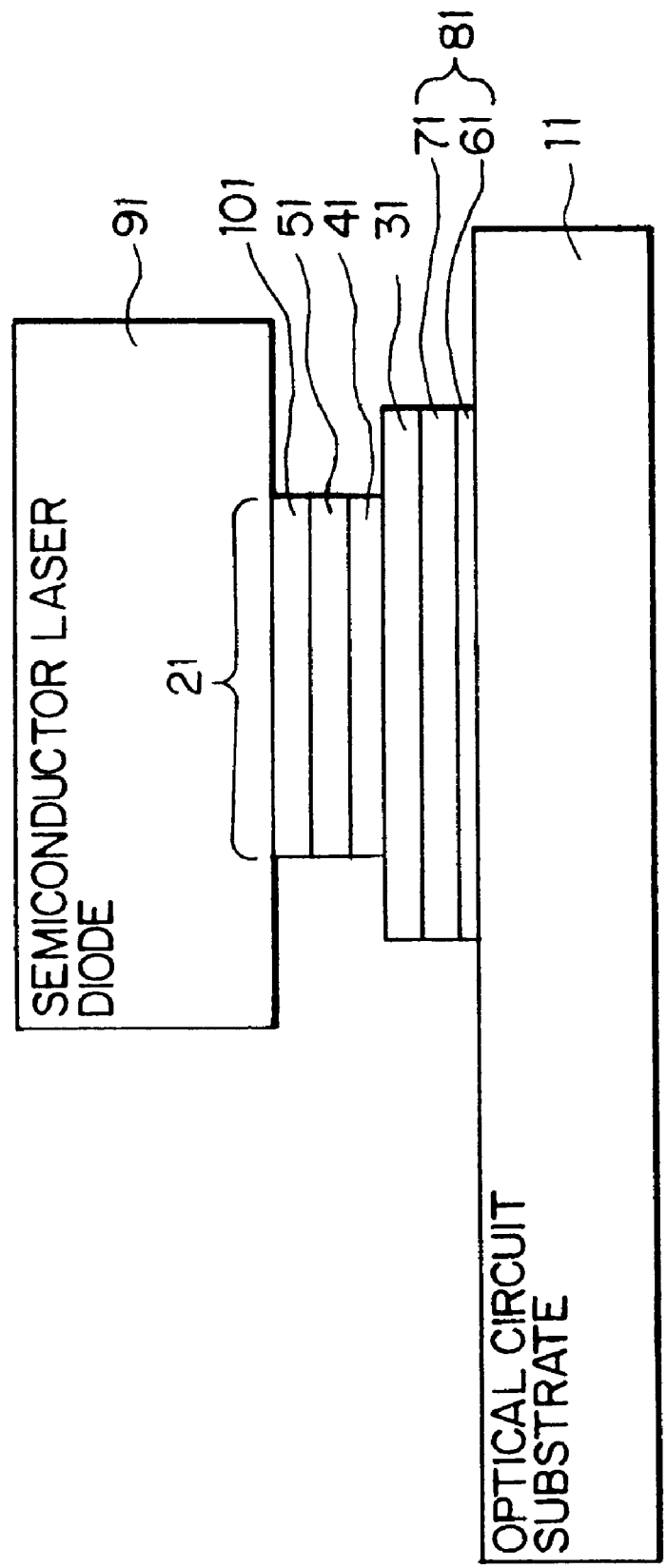

OPTICAL SEMICONDUCTOR DEVICE

This is a Divisional of application Ser. No. 08/233,941 filed Apr. 28, 1994, now abandoned.

BACKGROUND OF THE INVENTION

The present invention relates to an optical semiconductor device in which an optical semiconductor element is bonded with and fixed to an optical circuit substrate, and a manufacturing method of the same An example of an optical semiconductor device in which an optical semiconductor element is joined with an optical circuit substrate, is proposed in the pending U.S. patent application Ser. No. 08/126,769, entitled "Optical coupling equipment for An Optical Semiconductor and An Optical Fiber" by the inventors of the present patent application.

In order to join the optical semiconductor element with the optical circuit substrate, gold-tin (AuSn) eutectic solder is generally used. More particularly, the solder is first melted by heating and at this time the optical semiconductor element is placed on the optical circuit substrate to be pressed to the optical circuit substrate so that the optical semiconductor element can be joined on the optical circuit substrate.

However, because the AuSn eutectic solder is easily oxidized, the joining process must be performed in nitrogen atmosphere or reduction atmosphere in which hydrogen gas is slightly mixed with nitrogen gas. In addition, before the optical semiconductor element is pressed to the optical circuit substrate, a so-called "scrubbing process" needs to be performed in which the optical semiconductor element is applied with a pressure and is vibrated for removing an oxide film formed on the AuSn eutectic solder in advance.

As another bonding method, there is known the method in which Sn has been deposited on the junction area of an electrode of the optical circuit substrate or the junction area of the optical semiconductor element, and both the optical circuit substrate and the optical semiconductor element are heated and pressed to each other to form the junction. In this case, because Sn is easily oxidized, the non-oxidization atmosphere and the scrubbing process for the optical semiconductor element are required.

Further, there is another method other than the above methods in which a layer of AuSn eutectic solder is formed on a junction portion of the optical circuit substrate, a thin Au layer is formed on the layer of eutectic solder. An optical semiconductor element is placed on the Au layer so that the junction is formed by melting the layer of eutectic solder. The detail of this method is disclosed in Japanese Patent Application Laid-Open TokuKaiHei-1-138777 (1989).

There have been many proposals of the structure in which optical coupling to an optical fiber can be performed without optical axis alignment. For achieving the structure, the optical semiconductor element needs to be bonded with the optical circuit substrate at a predetermined position with a high precision. Even if the optical semiconductor element is to be positioned and bonded with a high precision of submicron order by use of the above conventional bonding methods, the junction position shifts because the optical semiconductor element is vibrated in the above scrubbing process.

A melt of AuSn eutectic solder is 20 to 30 $\mu$m in thickness. Therefore, when the optical semiconductor element is made to contact with the melted AuSn eutectic solder, the surface of an electrode layer of the optical semiconductor element is wet and at the same time the optical semiconductor element is randomly moved because of surface tension of the AuSn eutectic solder. Here, that "the electrode layer surface is wet" means that the melted AuSn eutectic solder extends thinly on the electrode layer surface. Further, because the optical semiconductor element falls into the melted AuSn eutectic solder by 10 to 20 $\mu$m by application of pressure, the positioning of the optical semiconductor element with the submicron order is very difficult in the conventional bonding methods.

Even if Sn is deposited, the scrubbing process is required because an oxide film is produced on the layer of eutectic solder like in the above joining methods. For this reason, it is impossible to position the optical semiconductor element at a predetermined position with a high precision of submicron order. In addition, it is difficult to produce a perfect AuSn eutectic layer only by diffusion of Sn and Au in bonding of the optical semiconductor element. In this case, a weight % ratio of Sn to Au becomes so great that a fragile metallic compound is easy to produce. Therefore, it is difficult to ensure reliability after bonding. Hence, it is necessary to strictly control the storage condition, a temperature in the bonding and a heating period.

Further, even in a case that a thin Au layer is deposited on an AuSn eutectic solder layer formed on a junction portion of the optical circuit substrate, it is necessary to make the Au layer thin for keeping the eutectic condition. Consequently, the scrubbing process would be required as in the above methods because Au of the Au layer and Sn of the AuSn eutectic solder layer diffuses mutually into the eutectic layer and the Au layer and as a result of this an oxide film is produced on the surface of the junction portion. In this case, if the deposited layer of Au is made so thick that the oxide film can be prevented from being producing, another problem is caused in which the eutectic condition cannot be kept because of the mutual diffusion of Au of the Au layer and Sn of the AuSn eutectic solder layer. In addition, it is often difficult to keep the stable bonded state after the melting and bonding when the peripheral temperature of the junction portion is raised, more particularly, in a high temperature because a melting point of the AuSn eutectic state is low.

SUMMARY OF THE INVENTION

An object of the present invention is to provide an optical semiconductor device having high reliability and including an optical semiconductor element which can be positioned on an optical circuit substrate with a high precision of submicron order, and a method of manufacturing the optical semiconductor device.

In the optical semiconductor device of the present invention, the optical semiconductor element is bonded with and fixed to the optical circuit substrate. At least one of the surface of a junction portion of the optical semiconductor element and the surface of a junction portion of the optical circuit substrate is provided with an Au layer formed thereon and one Au layer and one Sn layer are laminated in either one or both of the junction portions. The junction portions is made eutectic so that the optical semiconductor element is bonded with the optical circuit substrate through the junction portions.

In an embodiment of the present invention, a weight % ratio of Au and Sn in the junction portion of the optical circuit substrate is about 80%:20% before the junction is formed and a thin Au layer is formed on the junction portion surface of the optical semiconductor element. The junction portions are heated at a temperature of 280° C. or more so that Au and Sn are melted to form the junction. More particularly, Au layers and at least one Sn layer are laminated on the optical circuit substrate such that the top layer is the Au layer and a composition of Au of the Au layers including the top Au layer and Sn of the Sn layer is about 80% and 20% in weight %. In order to bond the optical semiconductor element with the optical circuit substrate, the optical semiconductor element is made to contact with the optical circuit substrate and pressed to it and then the whole of substrate and element is heated up. As the temperature rises, Au and Sn diffuse mutually into the Sn layer and the Au layer, respectively. The mutual diffusion of Au and Sn is more active at a temperature higher than the melting point of Sn.

When the whole of optical circuit substrate and optical semiconductor element is heated up to a temperature of 280° C. or more, the mutual diffusion of Au and Sn further proceeds so that the weight % ratio of Au and Sn becomes about 80%:20%. At this time the eutectic of AuSn is produced which wets the junction portion surface of the optical semiconductor element. If the heating state is kept, Sn diffuses into the electrode layer of the optical semiconductor element so that the interface between the electrode layer of the optical semiconductor element and the optical circuit substrate disappears. At this time cooling of the circuit substrate and the semiconductor element is started so that the junction is completely formed. The weight % ratio of Au to Sn after the junction is formed is at least 80% and the state of the junction shifts from the AuSn eutectic state to a slightly Au-rich state on the AuSn equilibrium phase diagram. As a result, the melting point of the junction becomes so high that the stable junction can be obtained. If the junction state is shifted to a Sn-richer state than the eutectic state, an alloy in the junction is fragile. However, as in the present invention, if the junction state is shifted to an Au-richer state than the eutectic state, such a problem is not caused.

BRIEF DESCRIPTION OF THE DRAWINGS

FIG. 8 is a diagram showing another embodiment of the present invention.

DETAILED DESCRIPTION OF THE PREFERRED EMBODIMENT

An optical semiconductor device according to an embodiment of the present invention will be described below with reference to the accompanying drawings.

Figure 1:
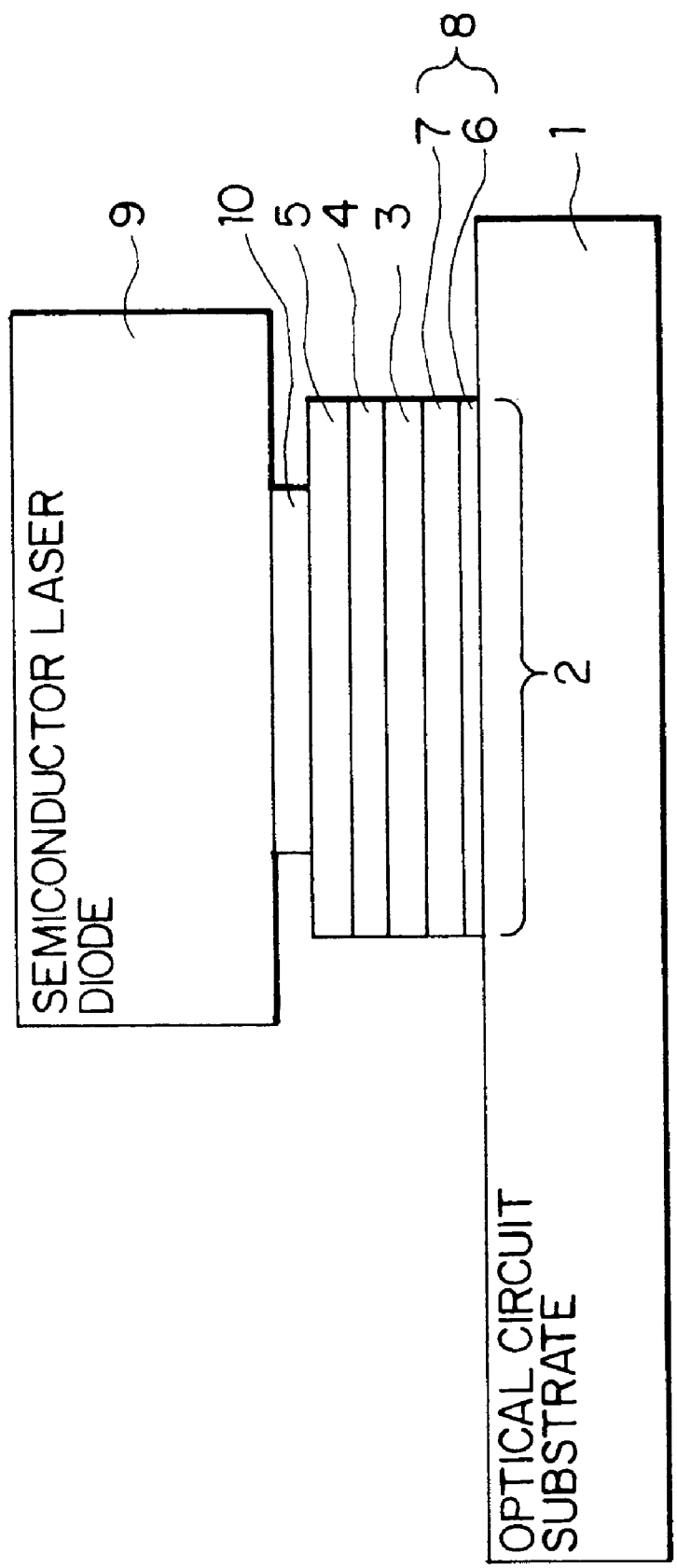
FIG. 1 is a diagram showing the structure of an optical semiconductor device according to an embodiment of the present invention.

FIG. 1 shows the structure of the optical semiconductor device according to the embodiment of the present invention. A barrier layer 8 including a titanium (Ti) layer 6 and a platinum (Pt) layer 7 formed thereon is formed on the optical circuit substrate 1. In the present embodiment, a silicon substrate is employed as the optical circuit substrate 1 which includes an optical wave-guide, and an optical separating/combining unit having an optical directional coupler or an optical Y branching unit.

An Au layer 3 and a Sn layer 4 are laminated on the barrier layer 8 in that order. Another Au layer 5 having a predetermined thickness is formed on the laminated layer of the Au layer 3 and the Sn layer 4 as a top layer. The barrier layer 8, the laminated layer and the top Au layer constitute a junction portion 2 of the optical circuit substrate 1.

The thickness of the top Au layer is predetermined to be about 0.4 μm, for example, so that an oxide layer is not easy to be produced on the laminated layer even if Au of the Au layer 5 and Sn of the Sn layer 4 are mutually diffused into the Sn layer 4 and the Au layer 5, respectively.

An Au electrode layer 10 of a semiconductor laser diode 9 as a junction portion of an optical semiconductor element 9 is made to contact with the top Au layer 5 of the junction portion 2 and the laser diode 9 is pressed to the optical circuit substrate 1. Then, heating is performed so that the semiconductor laser diode 9 can be bonded with the optical circuit substrate 1 through the junction portions.

Figure 2A:
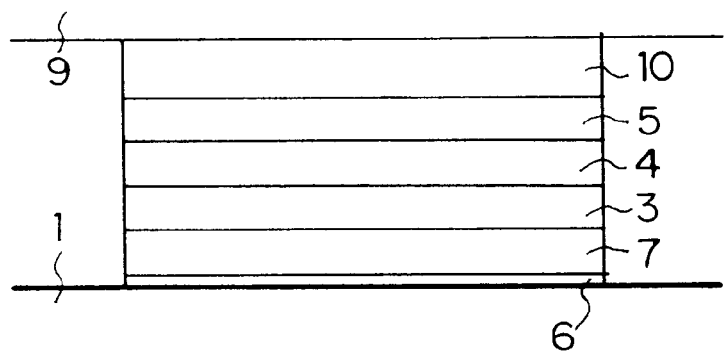
FIG. 2A is a diagram showing that an optical semiconductor element is pressed to a junction portion of an optical circuit substrate.
Figure 2B:
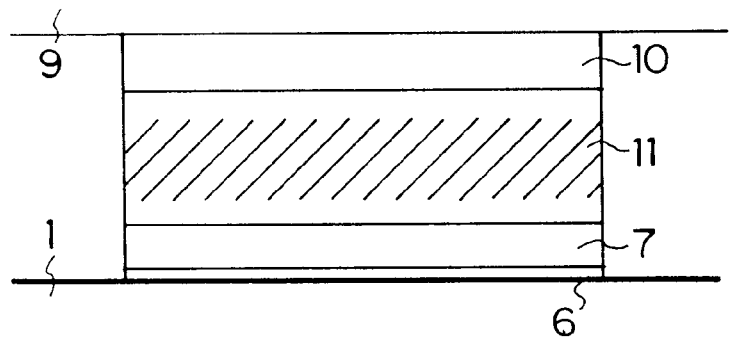
FIG. 2B is a diagram showing the state of mutual diffusion of Au into a Sn layer and Sn into an Au layer.
Figure 2C:
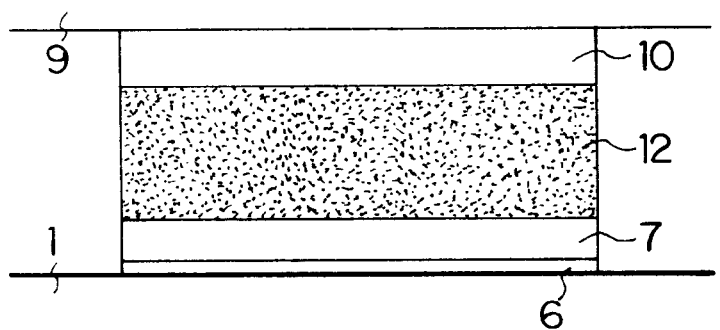
FIG. 2C is a diagram showing that an AuSn eutectic layer is produced.
Figure 2D:
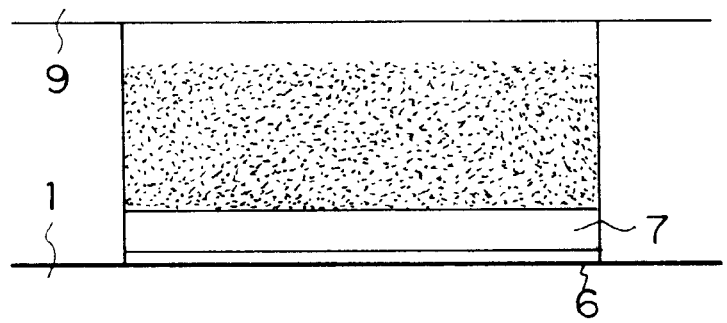
FIG. 2D is a diagram showing the diffusion state of Au and Sn between the electrode layer of the optical semiconductor element and the AuSn eutectic layer.

FIGS. 2A to 2D are diagrams showing the processes when the semiconductor laser diode 9 is bonded with the optical circuit substrate 1 as shown in FIG. 1. FIG. 2A shows the process in which the semiconductor laser diode 9 is applied with a pressure to be pressed to the optical circuit substrate 1. FIG. 2B shows the process in which Au of the Au layers 3 and 5 and Sn in the Sn layer 4 diffuse mutually into the Sn layer 4 and the Au layers 3 and 5, respectively. FIG. 2C shows the state in which an eutectic layer of Au and Sn is produced. FIG. 2D shows the process in which Au in the electrode layer 10 and Sn in the AuSn eutectic layer diffuse mutually into the eutectic layer and the electrode layer 10, respectively.

Next, the method of manufacturing the optical semiconductor device in the embodiment of the present invention will be described below in detail with reference to FIGS. 1 and 2A to 2D.

In order to join the semiconductor laser diode 9 with the optical circuit substrate 1, the semiconductor laser diode 9 is placed on the optical circuit substrate 1 such that the electrode layer 10 contacts with the top Au layer 5 of the junction portion 2, and is pressed to the optical circuit substrate 1, as shown in FIG. 2A.

Then, the optical circuit substrate 1 is heated at a temperature of 280° C. or less. As the temperature is increased, Au of the Au layers 3 and 5 and Sn of the Sn layer 4 start to diffuse mutually into the layer 4 and the layers 3 and 5 through interfaces between the Sn layer 4 and the Au layer 3 and between the Sn layer 4 and the Au layer 5, respectively, so that a diffusion layer 11 of Au and Sn is formed as shown in FIG. 2B.

Subsequently, when the optical circuit substrate 1 is heated at a temperature of 280° C. or more, the diffusion of Au and Sn is further accelerated. When the weight % ratio of Au and Sn reaches about 80:20, the eutectic layer 12 of Au and Sn is produced as shown in FIG. 2C. At this time, the contact surface of the electrode layer 10 is wet with the AuSn eutectic 12 so that unevenness of the contact surface is eliminated.

When the optical circuit substrate 1 is further heated up, Sn starts to diffuse into the inside of the electrode layer 10 of the semiconductor laser diode 9. As a result, the interface between the electrode layer 10 as the junction portion of the semiconductor laser diode 9 and the junction portion 2 of the optical circuit substrate 1 disappears, as shown in FIG. 2D. In this state the optical circuit substrate 1 is cooled so that the junction is completely formed.

In this manner, in the present invention, the Au layers and the Sn layer are laminated alternatively in the junction portion 2 such that the top layer of the junction portion 2 is the Au layer. In this case, the weight % ratio of Au in the Au layers including the top Au layer and Sn in the Sn layer is set to be 80:20 in the junction portion 2. Thus, it is made possible to form the plurality of layers of Au and Sn by depositing or sputtering. This allows these layers to be formed with a high precision in thickness and to be made thin.

In addition, by forming the junction portion 2 of the optical circuit substrate 1 as described above, the falling down of the semiconductor laser diode 9 in the height direction because of the application of pressure can be almost avoided in the formation of the junction. Therefore, the position of the semiconductor laser diode 9 in the height direction after it is bonded can be controlled with a precision of submicron order or less.

Further, because the surface area of the electrode layer 10 of the semiconductor laser diode 9 is large and the thickness of junction portion is very thin, the influence of surface tension of the AuSn eutectic 12 to the electrode layer 10 wet with the melted Ausn eutectic 12 is negligibly small. Even in the heating up when oxidization is easy to be made, the AuSn melting state can be easily achieved with no surface oxidation because there is the Au layer 5 as the top layer in the junction portion until a melted AuSn layer is produced.

For these reasons, a large position error of the semiconductor laser diode 9 due to the surface tension of the melted AuSn eutectic layer 12 is not caused and a scrubbing process for removing an oxide layer is unnecessary. In this manner, if the semiconductor laser diode 9 is positioned with a high precision before the bonding, the mounting of the laser diode 9 with a precision of submicron order can be made. In addition, if the optical circuit substrate 1 is stored with no contamination, complicated processes such as acid scrubbing process before the bonding process become unnecessary because the surface of the junction portion 2 is covered with the Au layer which is chemically stable.

Further, in a case where the AuSn alloy or eutectic layer is formed by deposition, it is difficult conventionally to form such a alloy layer having a uniform composition because of change of deposition condition. On the contrary, in the present invention, because the Au and Sn layers are sequentially formed by deposition or sputtering, the alloy layer having a uniform composition can be obtained only by controlling the thickness of each layer.

In the above embodiment of the present invention the junction portion 2 of the optical circuit substrate 1 is formed to have a multilayer structure. However, the multilayer structure may be formed on the surface of the semiconductor laser diode 9 as the junction or junction portions of both the optical circuit substrate 1 and the semiconductor laser diode 9. It is required in either case that the top layer of the junction portion having the multilayer structure formed on the substrate 1 or laser diode 9 is an Au layer having a predetermined thickness.

FIG. 8 shows the embodiment of the present invention where the multilayer structure is formed on the surface of the semiconductor laser diode 91 as the junction. In FIG. 8, a barrier layer 81 including a titanium (Ti) layer 61 and a platinum (Pt) layer 71 formed thereon is formed on the optical circuit substrate 11. A gold (Au) layer 31 is formed thereon to contact with the Au layer 41 of the junction portion 21 formed on the semiconductor laser diode 21 The junction portion 21 is formed by laminating the Au layer 101 and the tin (Sn) layer 51 in that order onto the semiconductor laser diode 91, with the Au layer 41 being formed on the Sn layer 51 to complete the junction portion 21.

Next, the optical semiconductor device having a different multilayer structure according to another embodiment of the present invention will be described below as a modification.

In a case where a very small chip such as an optical semiconductor element is bonded by use of the junction structure according to the present invention, the junction portion having the multilayer structure can be made thin because the junction area of the electrode layer of the optical semiconductor element is as small as 250 μm×60 μm in the semiconductor element of 300 μm square, for example. Each of the Au/Sn/Au layers used in the above embodiment has thickness of 1 to 2 μm. In a case where the multilayer structure of three layers of Au/Sn/Au is employed on the substrate side, a good result was obtained when three layers of Au/Sn/Au are 0.4, 0.6, and 0.4 μm in thickness, respectively, so that a total layer thickness is 1.4 μm, and the thickness of the Au layer on the optical semiconductor element is 0.4 μm.

Figure 3A:
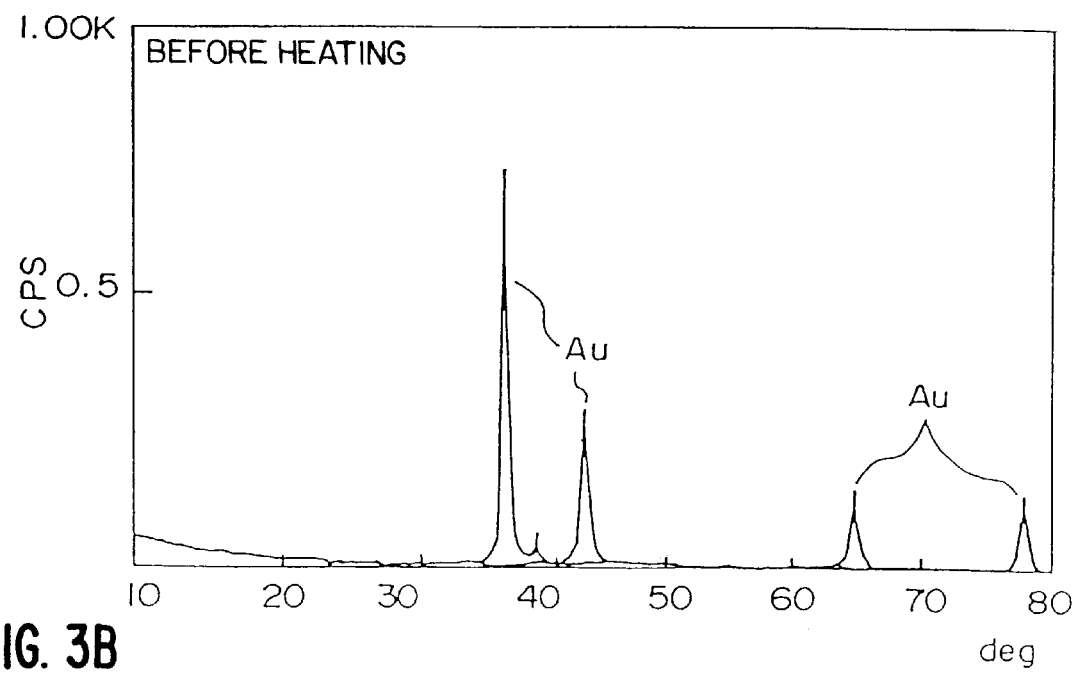
FIGS. 3A and 3B are diagrams showing component analysis results of the junction portion of the optical semiconductor element in the optical semiconductor device of the present invention by X-ray diffraction before and after heating, respectively.
Figure 3B:
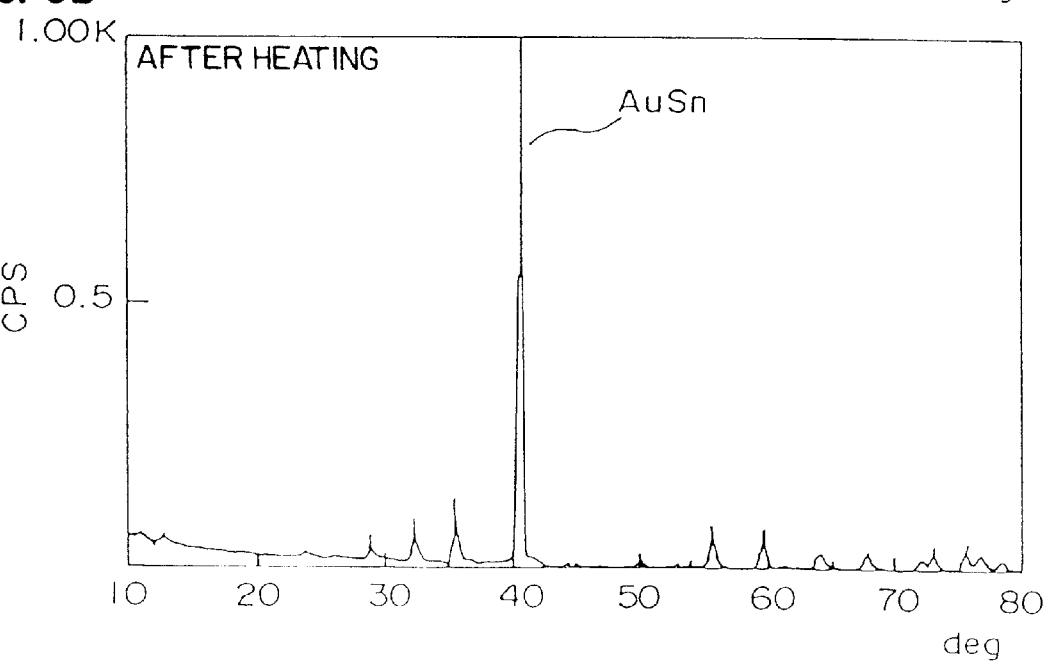

Description of the modification will be described below in which the three layers of Au/Sn/Au are 0.6, 0.6 and 0.2 μm in thickness. The basic structure of the junction portion is the same as in the above embodiment. After the semiconductor laser diode as the optical semiconductor element is pressed to the optical circuit substrate with a force of $2 \times 10^{-3}$ N, the whole of the laser diode and the substrate is heated at 340° C. in nitrogen atmosphere for 30 seconds. FIGS. 3A and 3B show the observation results of the junction portion of the semiconductor laser diode, where the alloy layer is formed, before and after the heating by the thin film X-ray diffraction. As seen from FIG. 3A, only the diffraction peaks of Au are identified before the heating and it could be recognized that the surface oxidation is suppressed. On the contrary, as seen from FIG. 3B, it could be recognized that Au and Sn diffuses mutually to form an AuSn alloy layer after the heating.

Figure 4:
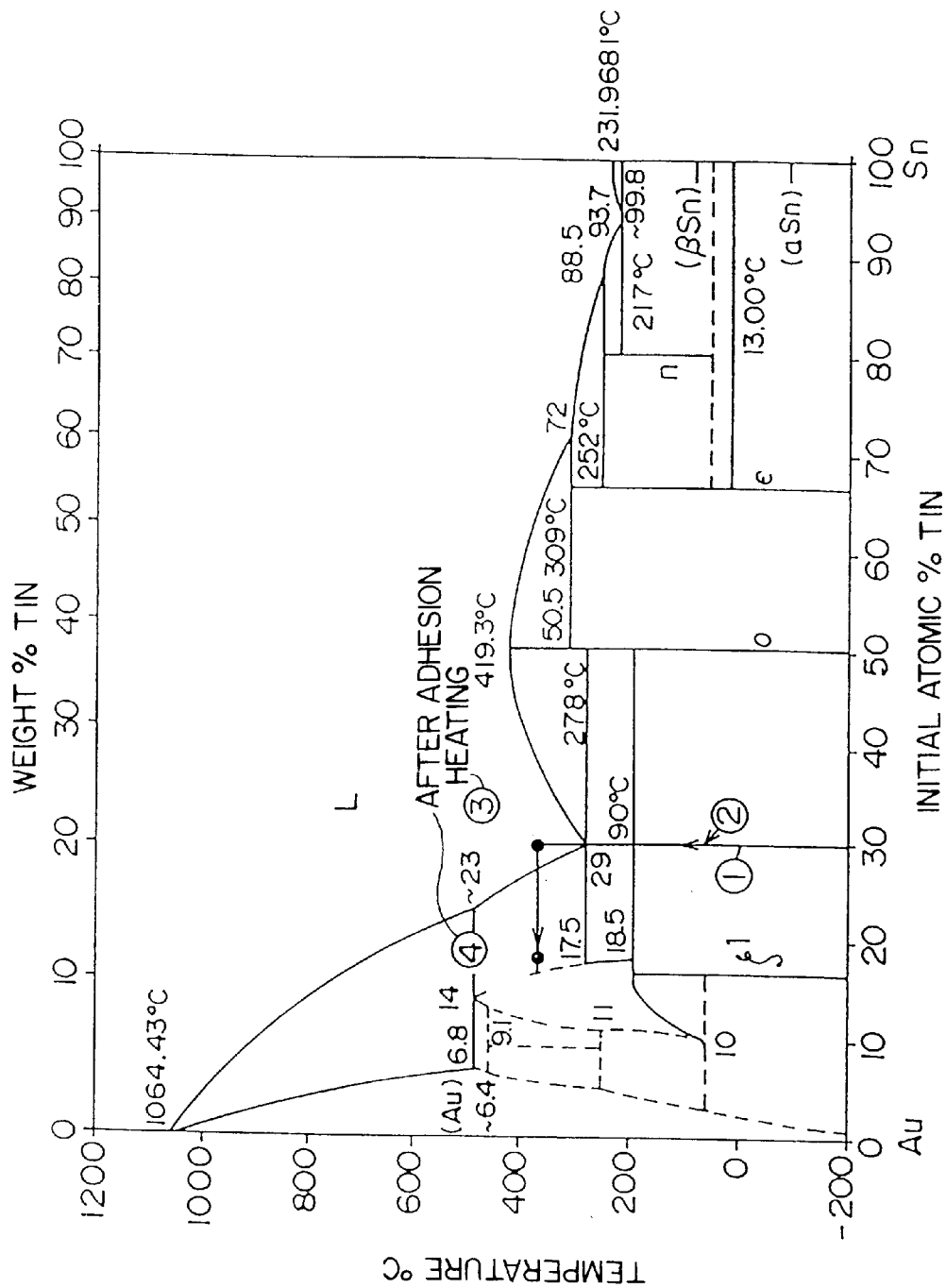
FIG. 4 is a AuSn equilibrium phase diagram showing change of the states of the junction portions in another embodiment of the present invention.

The change of the states of Au and Sn in the junction structure through melting by the heating and solidification by the cooling can be explained with reference to the AuSn equilibrium phase diagram shown in FIG. 4. Au/Sn/Au in the layers of the junction portion on the optical circuit substrate are in the state of ① in the figure before the heating, and Au and Sn are 70%:30% in atomic % and 80%:20% in weight %. As the temperature rises by the heating, the diffusion of Au and Sn proceeds so that the states change along the arrow of ②. When Au and Sn are fully melted, they are in the state of ③. Since the junction portion of the optical circuit substrate contacts with the Au electrode layer of the semiconductor laser diode as the junction portion, Sn further diffuses into the Au electrode layer. As a result, the state changes to the state of ④. When the heating is stopped in this state and the cooling is started, the junction is completely formed. Therefore, the weight % ratio of Au and Sn of the junction structure after the heating is different from that of the junction portion of the optical circuit substrate before the heating.

As described above, by employing the multilayer structure of the present invention, the scrubbing operation which is conventionally performed, is unnecessary and a perfect junction can be achieved. Therefore, there can be avoided the degradation of junction precision because of the scrubbing process.

Figure 5:
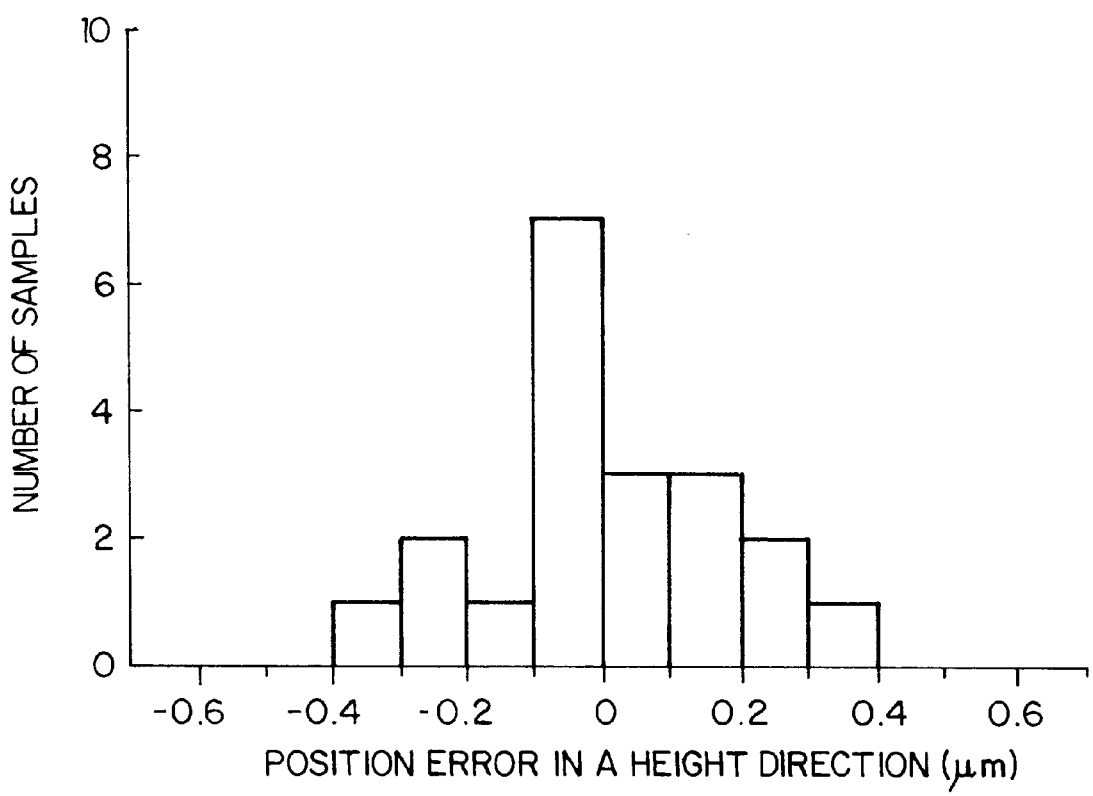
FIG. 5 is a diagram showing a measuring result of position errors in a height direction in the optical semiconductor device of the present invention.

Next, the junction precision of the semiconductor laser diode in the height and lateral directions will be described later which is joined in accordance with the junction structure of the present invention. FIG. 5 shows the measuring result of position errors of the semiconductor laser diode in the height direction. The deviation is σ=0.18 μm and very small. It should be noted that the junction structure extends slightly in the lateral direction because of the application of pressure in the melted state of AU and Sn in the junction portion of the circuit substrate so that the height of the junction structure is lowered by 0.4 μm, compared to that before the junction is formed. If the deviation is small in the height direction, the degradation of junction characteristic can be avoided by considering an offset for the deviation in advance.

Figure 6:
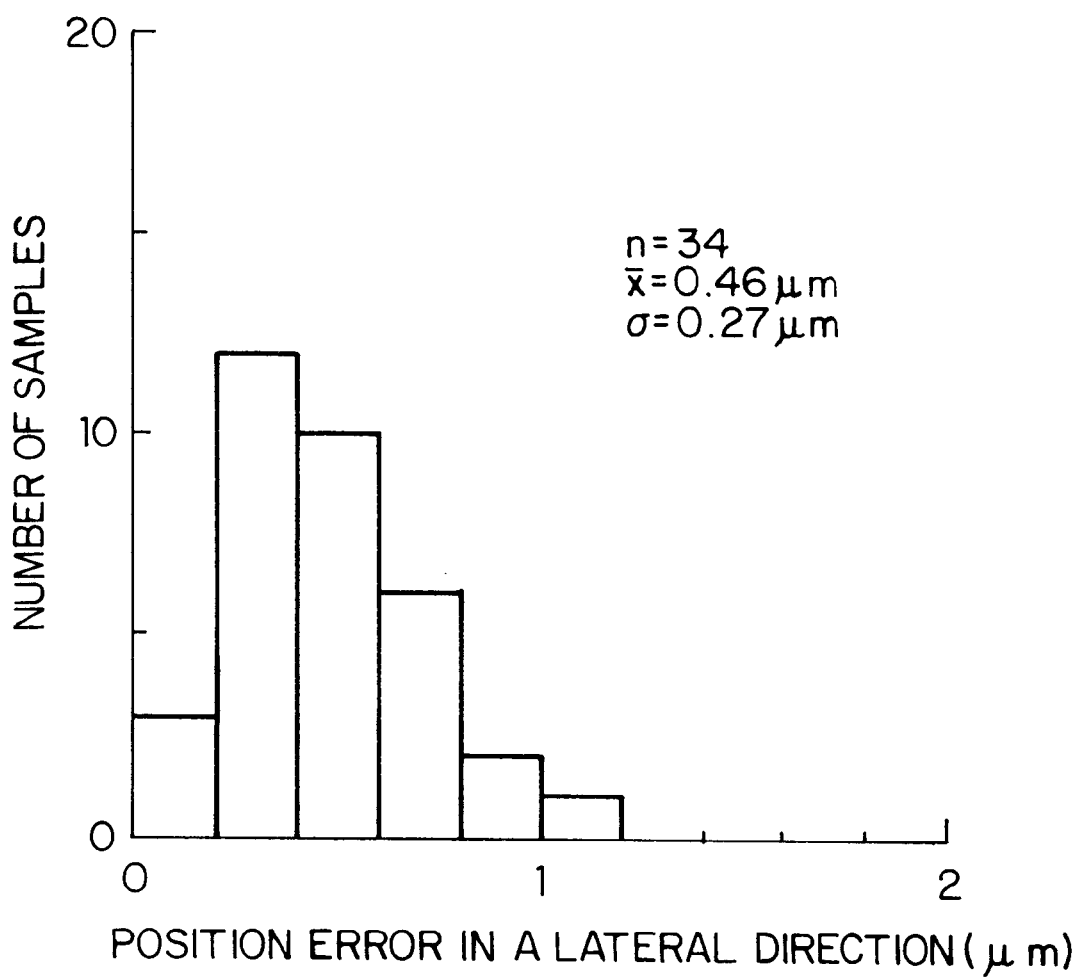
FIG. 6 is a diagram showing a measuring result of position errors in a lateral direction in the optical semiconductor device of the present invention.
Figure 7:
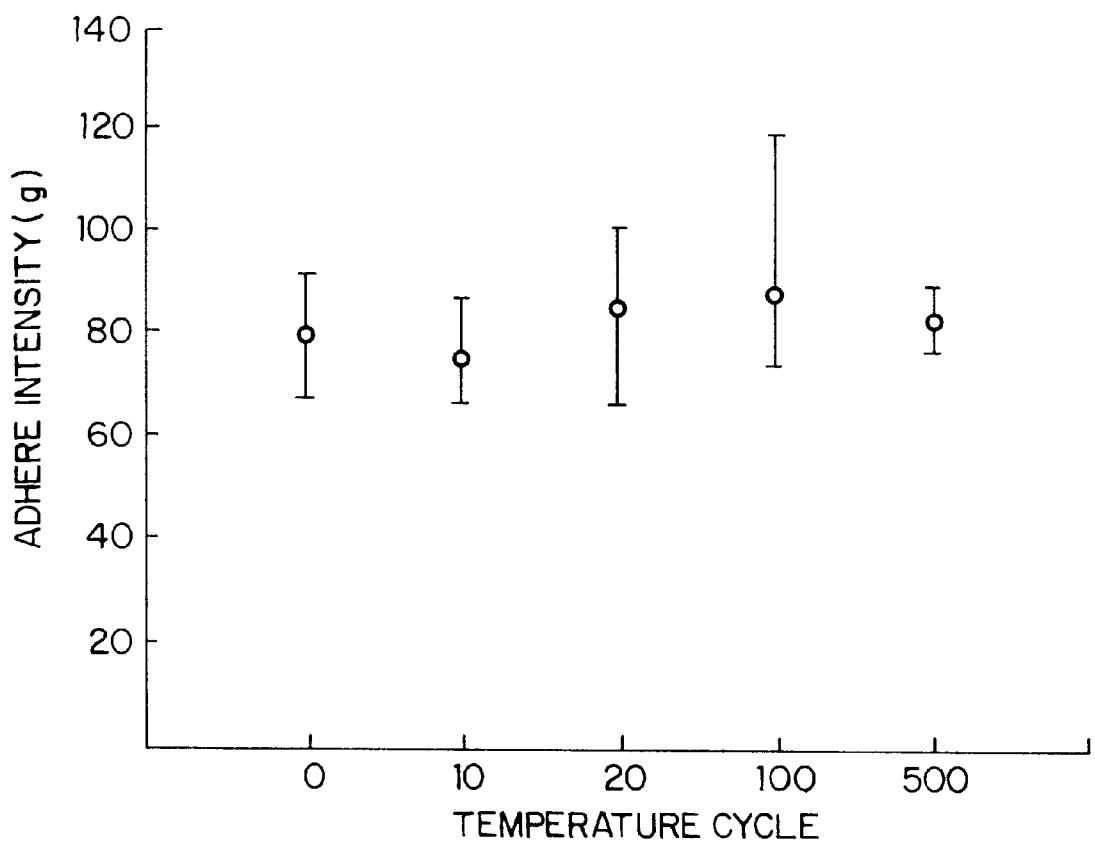
FIG. 7 is a diagram showing a result of die shear strength test for the junction of the optical semiconductor device of the present invention.

FIG. 6 shows the result when position errors of the semiconductor laser diode in the lateral or horizontal direction are measured by marking the substrate and semiconductor laser. Because the junction structure is relatively thin, the influence of the surface tension of the melted AuSn eutectic layer can be suppressed. In addition, because the scrubbing process is not necessary, the position error is 0.46 μm in average, resulting in a good junction result.

An initial junction strength is 80 gram in die shear strength and the degradation of it could not recognized even after application of heat cycle. More specifically, the stable junction structure was obtained by setting the weight % ratio of Au and Sn to be 80:20 in the junction portion of the optical circuit substrate and by shifting it from the eutectic state to a Au-richer state, compared to a case of the eutectic state maintained.

As described above, according to the present invention, the junction portion is provided on at least one of the optical semiconductor element and the optical circuit substrate and the junction portion includes the Au layer formed as the top layer and a layer in which Au layers and Sn layers are laminated and Au and Sn are made eutectic. The optical semiconductor element is joined with the optical circuit substrate by the eutectic. As a result, the optical semiconductor element can be positioned with a precision of submicron order. Further, the state of the junction structure is shifted from the eutectic state of Au and Sn to the Au-richer state than the eutectic state, so that the junction structure stable even in a high temperature can be obtained.

What is claimed is:

1. An optical semiconductor device in which an optical semiconductor element having a first gold (Au) layer is bonded on an optical circuit substrate having a second Au layer, said optical semiconductor device comprising:

a junction portion which is formed adjacent to at least one of the optical semiconductor element having the first Au layer and the optical circuit substrate having the second Au layer and which includes a eutectic section formed between the first Au layer and the optical semiconductor element or between the second Au layer and the optical circuit substrate, said eutectic section having at least one Au layer and at least one tin (Sn) layer, wherein said at least one of the first AU layer and the second Au layer adjacent to the eutectic section has a predetermined thickness and a weight percent ratio of Au and Sn in said junction portion is about 80%:20%.

2. The optical semiconductor device according to claim 1, wherein said at least one of the first Au layer and the second Au layer adjacent to the eutectic section has a thickness of 0.4 micrometers or more.

3. The optical semiconductor device according to claim 1, wherein a Au layer of the eutectic section has a thickness of 0.2 micrometers or more.

4. The optical semiconductor device according to claim 1, wherein a remaining one of said at least one of the first Au layer and the second Au layer is formed on a remaining one of said optical semiconductor element and said optical circuit substrate, said junction portion being not formed on the remaining one.

5. The optical semiconductor device according to claim 1, wherein said junction portion includes three layers of said top Au layer, said Sn layer and said Au layer.

6. The optical semiconductor device according to claim 5, wherein a total of thicknesses of said top Au layer, said Sn layer and said Au layer is in a range of 1 to 2 μm.

* * * * *